United States Patent [19]

Young

[11] Patent Number: 5,311,771

[45] Date of Patent: May 17, 1994

[54] METHOD FOR DETERMINING THE ROTATIONAL POSITION OF A CRANKSHAFT OF AN INTERNAL COMBUSTION ENGINE

[75] Inventor: Paul M. Young, Peoria, Ill.

[73] Assignee: Caterpillar Inc., Peoria, Ill.

[21] Appl. No.: 860,533

[22] Filed: Mar. 30, 1992

[51] Int. Cl.$^5$ .......................................... G01M 15/00
[52] U.S. Cl. ................................................ 73/117.3
[58] Field of Search ............................... 73/116, 117.3

[56] References Cited

U.S. PATENT DOCUMENTS

| | | | |
|---|---|---|---|
| 4,081,995 | 4/1978 | Griffith et al. | 73/116 |
| 4,158,305 | 6/1979 | Shipley | 73/117.3 |
| 4,262,526 | 4/1981 | Makita et al. | 73/116 |
| 4,653,315 | 3/1987 | Ament et al. | 73/117.3 |
| 4,779,454 | 10/1988 | Fitzner et al. | 73/116 |
| 4,782,692 | 11/1988 | Peden et al. | 73/117.3 |
| 4,788,956 | 12/1988 | Suzuki et al. | 73/116 |
| 4,892,103 | 1/1990 | Ogasawara | 128/660.01 |
| 5,040,412 | 8/1991 | Wannenwetsch | 73/116 |
| 5,041,979 | 8/1991 | Hirka et al. | 73/116 |
| 5,044,336 | 9/1991 | Fukui | 73/116 |
| 5,119,670 | 6/1992 | Whitehorn et al. | 73/116 |
| 5,165,271 | 11/1992 | Stepper et al. | 73/116 |

FOREIGN PATENT DOCUMENTS

0401757A2 12/1990 European Pat. Off. .
9010488 DE 9/1990 Fed. Rep. of Germany .
61-104215 JP 9/1986 Japan .

*Primary Examiner*—Hezron E. Williams
*Assistant Examiner*—George M. Dombroske
*Attorney, Agent, or Firm*—David M. Masterson

[57] ABSTRACT

In one aspect of the present invention, a method determines the rotational position of a crankshaft of an internal combustion engine. The method includes monitoring the rotation of the crankshaft and responsively producing a crankshaft pulsetrain. A clock signal is produced having a predetermined frequency. The clock signal and the crankshaft pulsetrain are received. Each pulse of the crankshaft pulsetrain is sampled, and responsively the period of each sampled pulse is determined. Signals representative of the determined pulse periods are produced. The method further includes receiving the determined pulse period signals, and responsively determining a value which is predictive of a period of the next pulse to be produced. A signal representative of the predictive value is produced, and the predictive value signal is received. An intermediate position signal based on the predictive value is produced. The intermediate position signal is representative of a predetermined angular rotation of the crankshaft.

8 Claims, 3 Drawing Sheets

Fig_1_

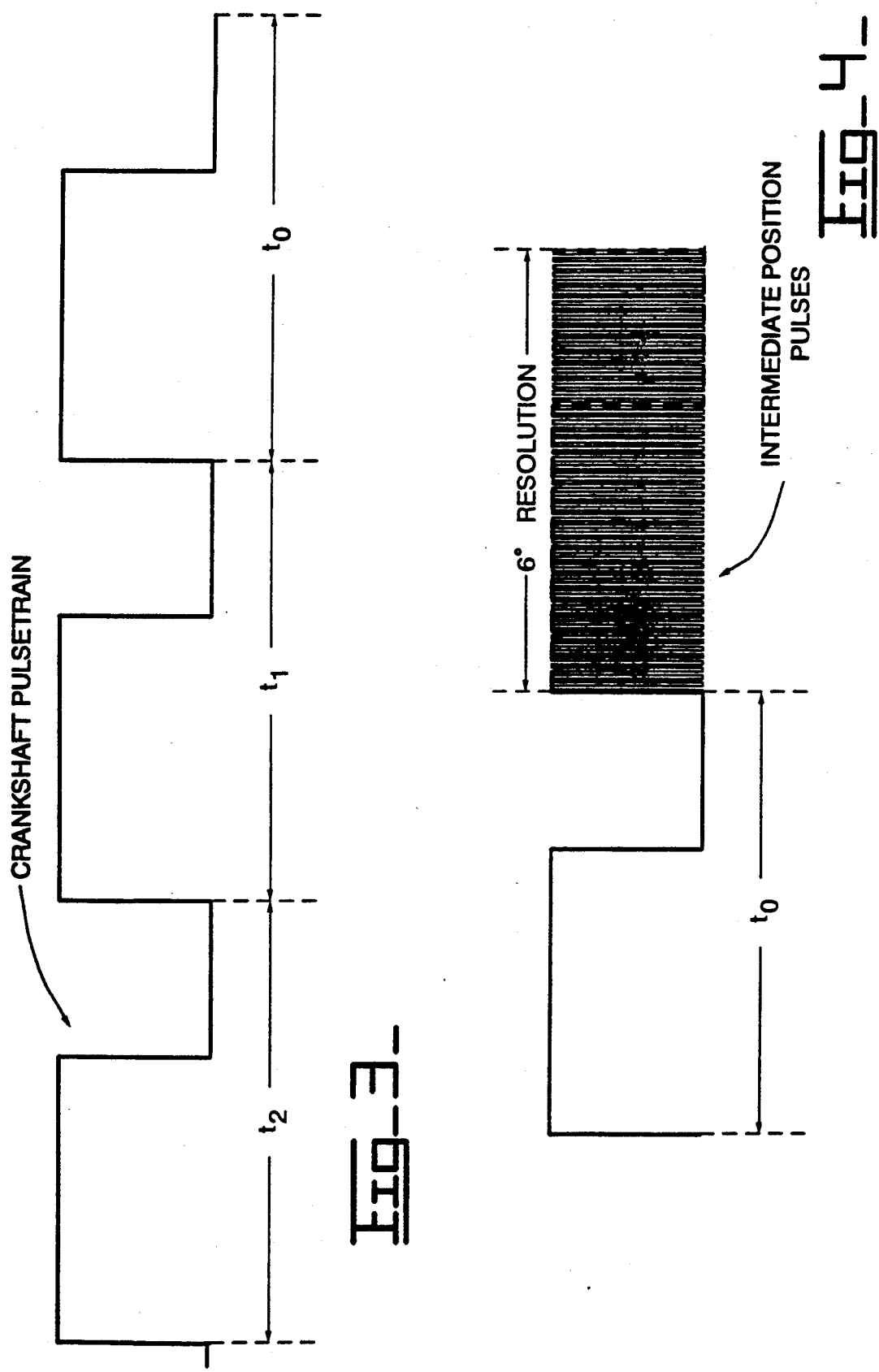

METHOD FOR DETERMINING THE ROTATIONAL POSITION OF A CRANKSHAFT OF AN INTERNAL COMBUSTION ENGINE

TECHNICAL FIELD

This invention relates generally to a method for determining the rotational position of a crankshaft and, more particularly, to a method for determining the rotational position of a crankshaft of an internal combustion engine.

BACKGROUND ART

Control of internal combustion engines has received substantial attention in the past several decades. Compression and spark ignition engine designs have attempted to achieve increased flexibility of engine operation. A plethora of designs have been directed to independent intake and exhaust valve actuation and electronic fuel injection. Many of these designs are directed to electronic and feedback control for engine timing. Systems using independent valve actuation and electronic fuel injection have been conceived to perform engine operational modes not attainable by cam-based engines.

The opening and closing of valves and injectors in "camless" engines may be typically controlled as a function of speed or angular position of the crankshaft. However, known crankshaft position detecting devices provide poor resolution. Resultantly, the timing information produced with these devices and methods fall short in accurately controlling the valves and fuel injectors.

The present invention is directed to overcome one or more of the problems as set forth above.

DISCLOSURE OF THE INVENTION

In one aspect of the present invention, a method determines the rotational position of a crankshaft of an internal combustion engine. The method includes monitoring the rotation of the crankshaft and responsively producing a crankshaft pulsetrain. A clock signal is produced having a predetermined frequency. The clock signal and the crankshaft pulsetrain are received. Each pulse of the crankshaft pulsetrain is sampled, and responsively the period of each sampled pulse is determined. Signals representative of the determined pulse periods are produced. The method further includes receiving the determined pulse period signals, and responsively determining a value which is predictive of a period of the next pulse to be produced. A signal representative of the predictive value is produced, and the predictive value signal is received. An intermediate position signal based on the predictive value is produced. The intermediate position signal is representative of a predetermined angular rotation of the crankshaft.

BRIEF DESCRIPTION OF THE DRAWINGS

For a better understanding of the present invention, reference may be made to the accompanying drawings in which:

FIG. 3 illustrates a crankshaft pulsetrain associated with an embodiment of the present invention; and FIG. 4 illustrates a predictive period of a next pulse of the crankshaft pulsetrain associated with an embodiment of the present invention.

BEST MODE FOR CARRYING OUT THE INVENTION

Figure 1:
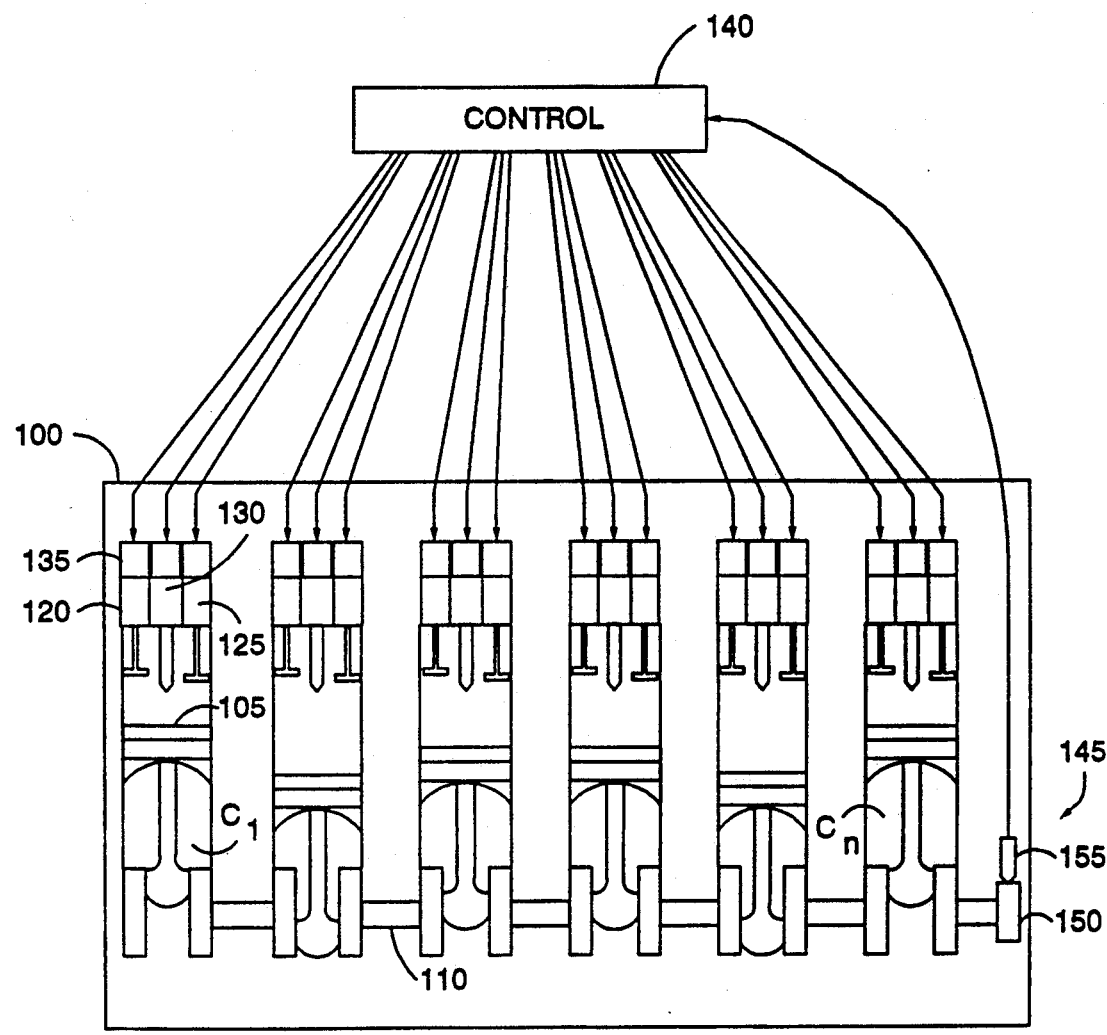
FIG. 1 is a block diagram representing an internal combustion engine in connection with an embodiment of the present invention.

FIG. 1 shows an internal combustion engine 100 having a plurality of cylinders Cl-Cn. Each cylinder includes a piston 105 connected to a crankshaft 110, and an intake valve 120, an exhaust valve 125, and an injector 130. The intake valve 120, exhaust valve 125, and the injector 130 are all electrically actuatable in response to control signals provided by an electronic controller 140. The electronic control 140 produces the control signals responsive to the rotational position of the crankshaft 110.

A sensing means 145 monitors the rotation of the crankshaft and responsively produces a crankshaft pulsetrain. The sensing means 145 includes a sensing wheel 150 having a plurality of spaced apart teeth connected to the engine crankshaft 110. The sensing means 145 also includes a magnetic pick-up device 155 located adjacent the sensing wheel 150. The rotation of the crankshaft 110 causes the teeth of the sensing wheel 150 to pass by the magnetic pick-up device 155. The magnetic pick-up device 155 senses each tooth as it passes adjacent the device and responsively produces the crankshaft pulsetrain. Each pulse on the pulsetrain is indicative of a sensing wheel tooth.

In the preferred embodiment the sensing wheel 150 has 60 equally spaced slots. The solid portion between the slots, referred to as teeth, are spaced about the wheel with two different widths. For example, three larger width teeth are placed about fifty-seven smaller width teeth in a predetermined pattern. The predetermined pattern corresponds to the top-dead center (TDC) position of cylinder #1. Thus, detection of the predetermined pattern corresponds to a complete rotation of the crankshaft 110. The sensing means 145 is well known in the art and will not be further discussed.

The present invention is adapted to accurately determine the rotational position of the crankshaft 110.

Figure 2:
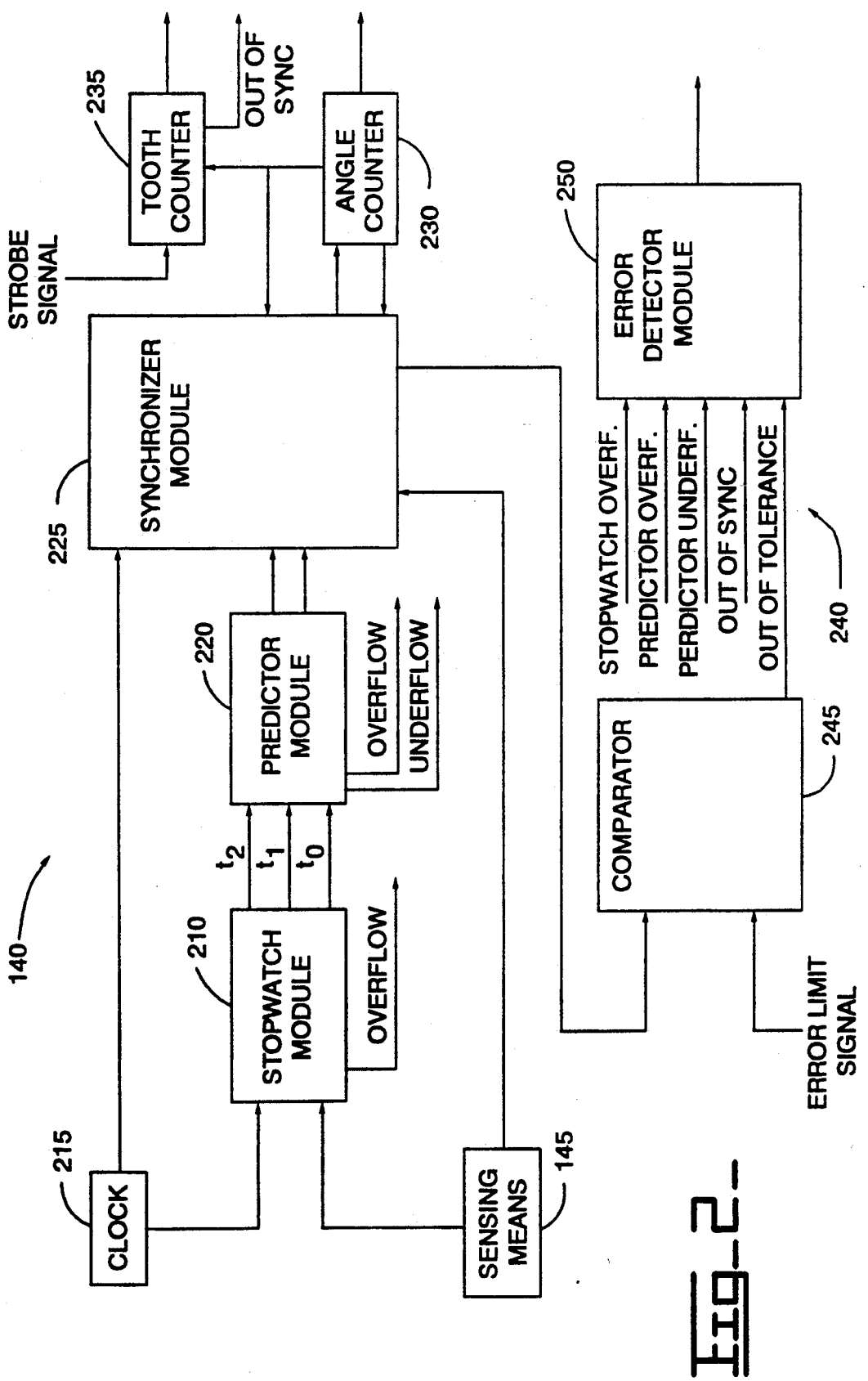
FIG. 2 is a block diagram associated with an embodiment of the present invention.

The block diagram of FIG. 2 depicts a complete working model of the present invention. The specific circuit configuration to carry-out the invention is a matter of design choice and is not critical to the present invention. However in the preferred embodiment, the various modules are implemented with field-programmable gate arrays manufactured by Xilinx.

As shown, the present invention is comprised of various modules including a stopwatch module 210, predictor module 220, synchronizer module 225, angle counter module 230, a tooth counter module 235, and an error module 240.

The stopwatch module 210 receives the crankshaft pulsetrain and responsively determines the period of each pulse. Further, the stopwatch module 210 receives a clock signal from a high frequency clock 215. In the present example, the frequency of the clock signal is 3.69 MHz. The stopwatch module 210 receives the crankshaft pulsetrain and samples each pulse with a sampling rate provided by the clock signal. Advantageously, the stopwatch module 210 measures the period of the three most recent pulses of the crankshaft pulsetrain. Here, a period is defined as the time interval between the rising edges of consecutive pulses as shown in FIG. 3.

A pulse is representative of a predetermined amount of crankshaft rotation. In the present (example, the period of the pulse represents 6° rotation of the crankshaft. The value of the pulse period is representative of the speed of the crankshaft rotation, i.e. engine speed. As shown, the three most recent pulses have values of $t_0$, $t_1$, $t_2$, respectively, where the last produced period has a value of $t_0$. Signals representative of the measured periods are delivered to the predictor module 220.

The predictor module 220 determines a value which is predictive of a period of the next pulse to be produced based on the measured period of the last three successive pulses of the crankshaft pulsetrain. For example, the predictor module 220 receives signals corresponding to the measured periods $t_0$, $t_1$, $t_2$ and responsively determines the predictive value, P, based on the following equation:

$$P=2.5*t_0-2.0*t_1+0.5*t_2,$$

This equation is derived from a second-order backward difference equation as follows:

$$P = \frac{1}{0!} t_o + \frac{1}{1!} (t_0 - t_1) + \frac{1}{2!} [(t_o - t_1) - (t_1 - t_2)]$$

The value of the predicted period, P, is then divided by a predetermined value. In the present example, the predetermined value is 128. The integer result is referred to as the quotient and the fractional result is referred to as the remainder. Signals representative of the magnitude of the quotient and remainder are delivered to the synchronizer module 225.

The synchronizer module 225 receives a signal representative of the predictive value and produces an intermediate position signal. The intermediate position signal is an electronic pulse wherein each pulse is representative of a predetermined angular rotation of the crankshaft 110. For example, the pulse of the intermediate position signal represents a 0.05° rotation of the crankshaft 110. In the preferred embodiment, the synchronizer module 225 receives the clock signal from the high frequency clock 215 and produces the intermediate position signal in response receiving a predetermined number of pulses of the clock signal. The predetermined number of clock pulses is determinative of the magnitude of the quotient and remainder signals. Additionally, the synchronizer module 225 utilizes values obtained from the angle counter 230. For example, the angle counter 230 produces a series of random numbers ranging from 0 to 127. Responsive to each pulse of the intermediate position signal, the angle counter 230 delivers a signal representative of a distinct random number to the synchronizer module 225.

Preferably, the synchronizer module 225 produces each intermediate position signal with respect to the following steps:
(a) The synchronizer module 225 compares the magnitude of remainder signal to a corresponding random number signal;
(b) if the remainder magnitude is greater than the corresponding random number, then a flag is set to "1";
(c) otherwise the flag is set to "0"; and
(d) the predetermined number of clock pulses, N, is then calculated by the following equation:

$$N=(Quotient+Flag)$$

The angle counter 230 monitors the rotational position of the crankshaft 110. For example, the angle counter 230 produces a crankshaft position signal in response to the intermediate position signal. The crankshaft position signal is a digital representation of the crankshaft angle. The crankshaft position signal has angular values ranging from 0° to 6°. Advantageously, the crankshaft position signal has an angular resolution of 0.05°. Thus, the angle counter 230 receives a pulse of the intermediate position signal, increments the representative angular value of the crankshaft position by 0.05°, and produces the crankshaft position signal. Further, the angle counter 230 generates a full count signal in response to receiving a predetermined number of pulses of the intermediate position signal from the synchronizer module 225. As shown in FIG. 4 the predetermined number of pulses of the intermediate position signal approximates the predictive period, shown in phantom lines. In the present example, the predetermined number of pulses of the intermediate position signal is 128. Thus, the full count signal is associated with a predetermined sensing wheel tooth and represents a 6° rotation of the crankshaft.

The tooth counter 235 monitors the rotational position of the crankshaft 110 by tracking the position of the sensing wheel 150. For example, the tooth counter 235 receives the full count signal from the angle counter 230 and counts the receipt of each signal. Responsively, the tooth counter 235 produces a tooth count signal which is a digital representation of a predetermined tooth on the sensing wheel 145. In this manner the tooth counter tracks the rotational position of the sensing wheel and thus the rotational position of the crankshaft. In the present example, 120 occurrences of the full count signal corresponds to a 720° rotation of the crankshaft 110. Thus, the tooth count signal corresponds to angular values ranging from 0° to 720° at 6° increments. To insure that the tooth counter 235 is synchronized with the sensing wheel 150, the tooth counter 235 receives a strobe signal. The strobe signal represents a 720° rotation of the crankshaft 110. The strobe signal may be produced in response to the predetermined pattern of the crankshaft pulsetrain. An out-of-sync error signal is produced in the event that the tooth counter 235 is not synchronized with the strobe signal.

The present invention predicts the period of the next pulse of the crankshaft pulse train to be produced. Based on this information the present invention can accurately determine the rotation of the crankshaft with high accuracy. Further, the present invention is adapted to correct leading or lagging timing discrepancies.

A leading timing discrepancy may arise when the full count signal is generated before the next pulse of the crankshaft pulsetrain has been produced, e.g. the crankshaft 110 has not rotated 6°. If this condition occurs the synchronizer module 225 delays the delivery of the intermediate position signal to the angle counter 230, until the rising edge of the next pulse of the crankshaft pulsetrain is produced. Advantageously, the synchronizer module 225 counts the number of clock pulses during this condition and responsively delivers a leading error signal to the error module 240.

A lagging timing discrepancy may arise when the next pulse of the crankshaft pulsetrain is produced before the full count signal is generated, e.g. the crankshaft 110 has already rotated 6°. If this condition occurs the synchronizer module 225 produces the intermediate position signal at the same frequency as the clock signal, until the full count signal is produced. Advantageously, the synchronizer module 225 counts the number of crankshaft position pulses produced at the clock frequency and responsively delivers a lagging error signal to the error module 240.

The error module 240 receives the error signals and takes corrective action if necessary. The error module 240 includes a comparator 245 and an error detector module 250. The comparator 245 receives the leading or lagging error signal from the synchronizer module 225 and compare the value of the error signal to a calculated error limit value. A microprocessor or other processing device may calculate the error limit value. Further, the error limit value may be modified during engine operation. In the present example, the error limit value corresponds to 1.5°. The comparator 245 produces an out-of-tolerance signal in response to the error signal being greater than the error limit.

The error detector module 250 receives the stopwatch overflow, predictor overflow and underflow error signals. The error signals are largely determinative of engine speed. For example, a stopwatch or predictor overflow error occurs when the speed of the engine is less than 7 rpm. A predictor underflow error occurs when the engine speed is greater than 28800 rpm, for example. The error detector module 250 also receives the out-of-sync and out-of-tolerance signals. In response to any of these signal the error detector module 250 may take any corrective action. For example, the corrective action may include ceasing the production of the control signals to the exhaust valves 125, intake valves 120, and injectors 130.

INDUSTRIAL APPLICABILITY

With the advent of "camless" engines, it becomes increasingly important to provide timing information with high accuracy. Advantageously, the present invention precisely monitors the rotation of the crankshaft and provides accurate timing information.

In summary, the present invention receives the crankshaft pulsetrain. The period of each pulse of the pulsetrain is indicative of a 6° rotation of the crankshaft. However, to precisely control the valves and the fuel injector a much greater angular resolution is needed. Advantageously, the present invention predicts the period of the next pulse to be produced based on the periods of the last three successive pulses. Thus, the predictive period is responsive to changing engine speed. The value of the predictive period is used to produce the intermediate position signal, which is representative of a 0.05° rotation of the crankshaft 110. Responsively, digital signals representative of the crankshaft position may then be used by the electronic control to accurately actuate the valves and fuel injector for optimum engine operation.

Other aspects, objects and advantages of the present invention can be obtained from a study of the drawings, the disclosure and the appended claims.

I claim:

1. A method for determining the rotational position of a crankshaft of an internal combustion engine, comprising the steps of:
   monitoring the rotation of the crankshaft and responsively producing a crankshaft pulsetrain;
   producing a clock signal with a predetermined frequency;
   receiving the clock signal and the crankshaft pulsetrain, sampling each pulse of the crankshaft pulsetrain, responsively determining the period of each sampled pulse, and producing signals representative of the determined pulse periods;
   receiving the determined pulse period signals, responsively determining a value which is predictive of a period of the next pulse to be produced, and producing a signal representative of the predictive value; and
   receiving the representative predictive value signal, and producing an intermediate position signal based on the predictive value, the intermediate position signal being an electronic pulse wherein each pulse is representative of a predetermined angular rotation of the crankshaft.

2. A method, as set forth in claim 1, including the step of receiving the intermediate position signal and responsively producing a crankshaft position signal representative of the rotational position of the crankshaft, the crankshaft position signal having digital values representing 0° to 6°.

3. A method, as set forth in claim 2, including the step of receiving a predetermined number of pulses of the intermediate position signal and responsively generating a full count signal, the full count signal being representative of a 6° rotation of the crankshaft.

4. A method, as set forth in claim 3, including the step of receiving the full count signal and responsively producing a tooth count signal, the tooth count signal having values representing a 0° to 720° rotation of the crankshaft.

5. A method, as set forth in claim 4, wherein the predictive value, P, is determined by the formula:

$$P = 2.5 * t - 2.0 * t1 + 0.5 * t2,$$

the values of t0, t1 and t2 corresponding to the periods of three successive pulses of the crankshaft pulsetrain.

6. A method, as set forth in claim 5, including the steps of receiving the clock signal and producing the intermediate position signal in response to receiving a predetermined number of clock pulses.

7. A method, as set forth in claim 6, including the steps of dividing the predictive value by a predetermined value and responsively producing a quotient and remainder signal having values representative the division.

8. A method, as set forth in claim 7, wherein the predetermined number of clock pulses is responsive to the values of the quotient and remainder signals.

* * * * *